United States Patent
Hsieh et al.

(10) Patent No.: US 10,153,278 B1
(45) Date of Patent: Dec. 11, 2018

(54) FIN-TYPE FIELD EFFECT TRANSISTOR STRUCTURE AND MANUFACTURING METHOD THEREOF

(71) Applicant: Taiwan Semiconductor Manufacturing Co., Ltd., Hsinchu (TW)

(72) Inventors: Sheng-Lin Hsieh, New Taipei (TW); I-Chih Chen, Tainan (TW); Chih-Mu Huang, Tainan (TW); Ching-Pin Lin, Hsinchu County (TW); Ru-Shang Hsiao, Hsinchu County (TW); Ting-Chun Kuan, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/717,972

(22) Filed: Sep. 28, 2017

(51) Int. Cl.
    *H01L 27/08* (2006.01)
    *H01L 27/088* (2006.01)
    (Continued)

(52) U.S. Cl.
    CPC .... *H01L 27/0886* (2013.01); *H01L 21/02636* (2013.01); *H01L 21/30604* (2013.01); *H01L 21/31111* (2013.01); *H01L 21/76224* (2013.01); *H01L 21/823431* (2013.01); *H01L 21/823437* (2013.01); *H01L 21/823481* (2013.01); *H01L 29/0649* (2013.01); *H01L 29/0847* (2013.01); *H01L 29/1037* (2013.01); *H01L 29/6653* (2013.01); *H01L 29/6656* (2013.01); *H01L 21/02057* (2013.01); *H01L 21/02532* (2013.01); *H01L 21/02609* (2013.01); *H01L 21/3081* (2013.01); *H01L 21/3086* (2013.01); *H01L 21/31116* (2013.01); *H01L 29/165* (2013.01); *H01L 29/167* (2013.01); *H01L 29/7848* (2013.01)

(58) Field of Classification Search
    CPC .......... H01L 27/0886; H01L 21/02636; H01L 21/30604; H01L 21/31111; H01L 21/76224; H01L 21/823431; H01L 29/0649; H01L 29/0847; H01L 29/6653; H01L 29/6656
    See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |

(Continued)

*Primary Examiner* — Nathan W Ha
(74) *Attorney, Agent, or Firm* — JCIPRNET

(57) ABSTRACT

A fin-type field effect transistor comprising a substrate, at least one gate stack, spacers and epitaxy material portions is described. The substrate has fins and insulators located between the fins, and the fins comprise channel portions and flank portions beside the channel portions, the flank portions and the channel portions of the fins are protruded from the insulators, the flank portions of the fins and the channel portions of the fins have substantially a same height from top surfaces of the insulators, and each of the flank portions of the fins has a top surface and side surfaces adjoining the top surface. The at least one gate stack is disposed over the substrate, disposed on the insulators and over the channel portions of the fins. The spacers are disposed on the side surfaces of the flank portions of the fins. The epitaxy material portions are located above the top surfaces of the flank portions of the fins.

20 Claims, 16 Drawing Sheets

(51) Int. Cl.
*H01L 29/10* (2006.01)
*H01L 29/08* (2006.01)
*H01L 21/306* (2006.01)
*H01L 21/8234* (2006.01)
*H01L 21/762* (2006.01)
*H01L 29/66* (2006.01)
*H01L 21/02* (2006.01)
*H01L 21/311* (2006.01)
*H01L 29/06* (2006.01)
H01L 29/167 (2006.01)
H01L 21/308 (2006.01)
H01L 29/78 (2006.01)
H01L 29/165 (2006.01)

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |

# FIN-TYPE FIELD EFFECT TRANSISTOR STRUCTURE AND MANUFACTURING METHOD THEREOF

BACKGROUND

As the semiconductor devices keep scaling down in size, three-dimensional multi-gate structures, such as the fin-type field effect transistor (FinFET), have been developed to replace planar CMOS devices. A characteristic of the FinFET device lies in that the structure has one or more silicon-based fins that are wrapped around by the gate to define the channel of the device. The gate wrapping structure further provides better electrical control over the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
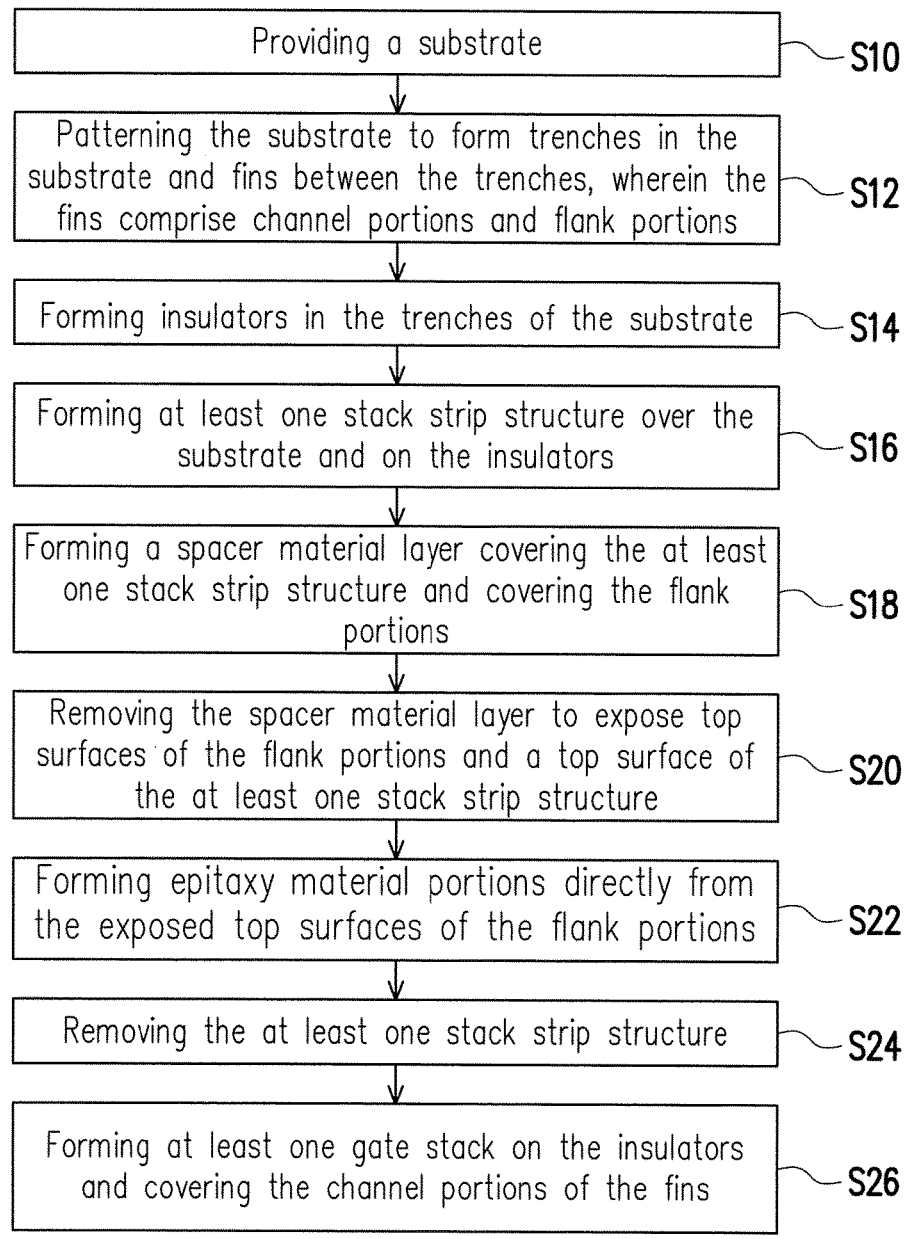
FIG. 1 is a flow chart illustrating a method for manufacturing a FinFET in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The embodiments of the present disclosure describe the exemplary manufacturing processes of a three-dimensional structure with height differences and the structure(s) fabricated there-from. Certain embodiments of the present disclosure describe the exemplary manufacturing processes of FinFET devices and the FinFET devices fabricated there-from. The FinFET device may be formed on a monocrystalline semiconductor substrate, such as a bulk silicon substrate in certain embodiments of the present disclosure. In some embodiments, the FinFET device may be formed on a silicon-on-insulator (SOI) substrate or a GOI (germanium-on-insulator) substrate as alternatives. Also, in accordance with the embodiments, the silicon substrate may include other conductive layers, doped regions or other semiconductor elements, such as transistors, diodes or the like. The embodiments are intended to provide further explanations but are not used to limit the scope of the present disclosure.

In accordance with the embodiments, FIG. 1 is a flow chart showing the process steps of the manufacturing method for forming a FinFET. The various process steps of the process flow illustrated in FIG. 1 may comprise multiple process steps as discussed below. FIGS. 2A-2H are perspective views showing the FinFET at various stages of a method for fabricating a FinFET in accordance with some embodiments of the present disclosure, and FIGS. 3A-3H are cross-sectional views showing the FinFET at various stages of a method for fabricating a FinFET in accordance with some embodiments of the present disclosure. It is to be noted that the process steps described herein cover a portion of the manufacturing processes used to fabricate a FinFET device.

Figure 2A:
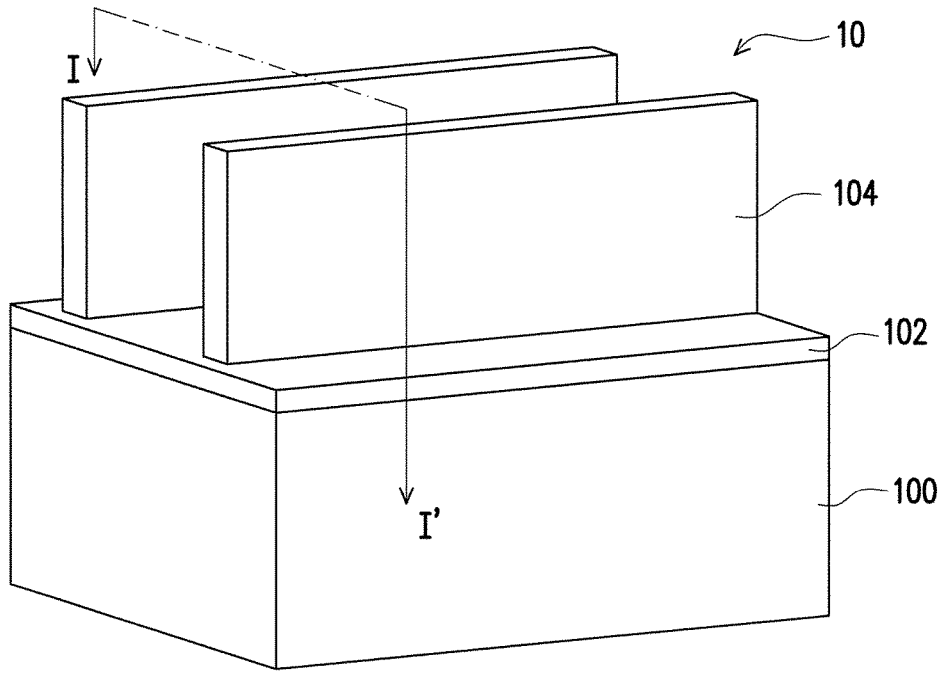
FIGS. 2A-2H are perspective views showing the FinFET at various stages of a method for fabricating a FinFET in accordance with some embodiments of the present disclosure.
Figure 3A:
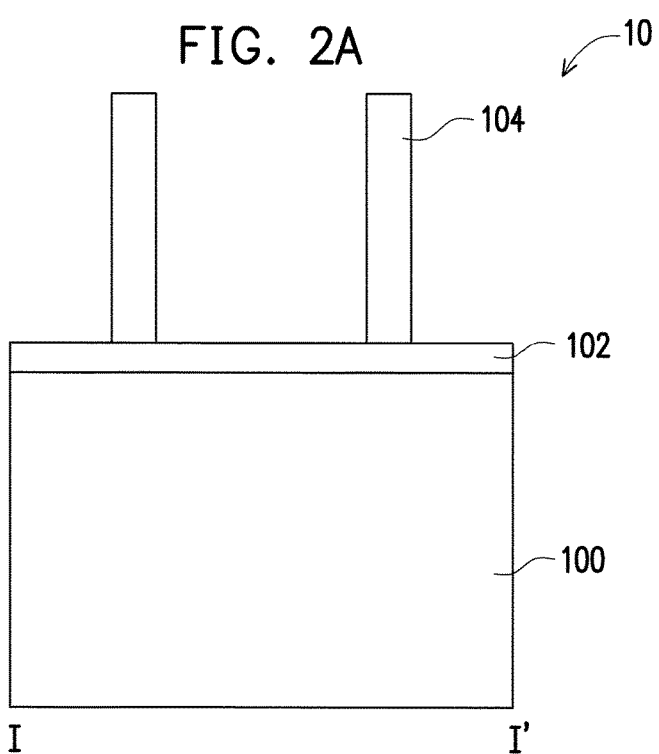
FIGS. 3A-3H are cross-sectional views showing the FinFET at various stages of a method for fabricating a FinFET in accordance with some embodiments of the present disclosure.

FIG. 2A is a perspective view of the FinFET 10 at one of various stages of the manufacturing method, and FIG. 3A is a cross-sectional view of the FinFET 10 taken along the line I-I' of FIG. 2A. In Step S10 in FIG. 1 and as shown in FIG. 2A and FIG. 3A, a substrate 100 is provided. In one embodiment, the substrate 100 comprises a crystalline silicon substrate (e.g., wafer). The substrate 100 may comprise various doped regions depending on design requirements (e.g., p-type substrate or n-type substrate). In some embodiments, the doped regions are doped with p-type and/or n-type dopants. For example, the p-type dopants are boron or $BF_2$ and the n-type dopants are phosphorus or arsenic. The doped regions may be configured for an n-type FinFET or a p-type FinFET. In some alternative embodiments, the substrate 100 is made of other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In one embodiment, a mask layer 102 and a photo-sensitive pattern 104 are sequentially formed on the substrate 100. In at least one embodiment, the mask layer 102 is a silicon nitride layer formed, for example, by low-pressure chemical vapor deposition (LPCVD) or plasma enhanced chemical vapor deposition (PECVD). The mask layer 102 is used as a hard mask during subsequent photolithography processes. Then, a photo-sensitive pattern 104 having a predetermined pattern is formed on the mask layer 102.

Figure 2B:
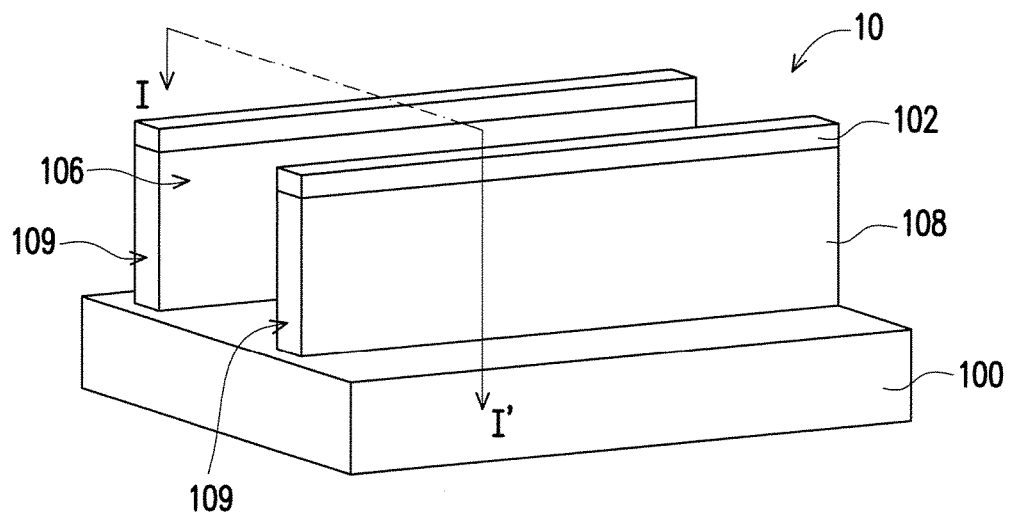
Figure 3B:
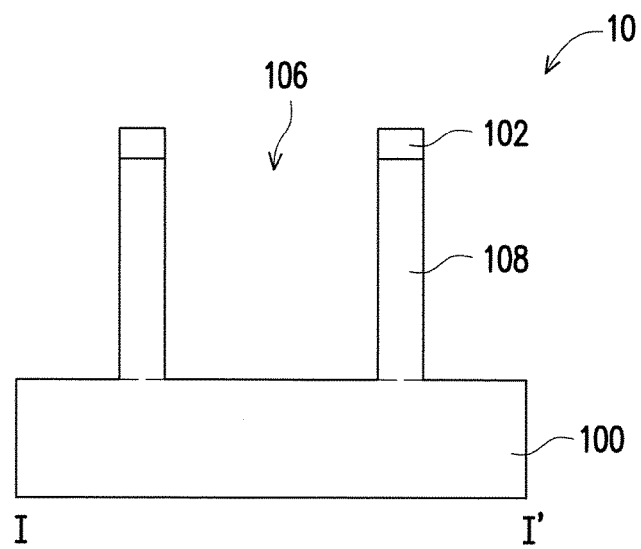

FIG. 2B is a perspective view of the FinFET 10 at one of various stages of the manufacturing method, and FIG. 3B is a cross-sectional view of the FinFET 10 taken along the line I-I' of FIG. 2B. In Step S12 in FIG. 1 and as shown in FIG. 2B and FIG. 3B, the substrate 100 is patterned to form trenches 106 into the substrate 100 and fins 108 are formed between the trenches 106, using the photo-sensitive pattern 104 and the mask layer 102 as etching masks. In certain embodiments, the trenches 106 are strip-shaped trenches arranged in parallel, and the fins 108 are arranged in parallel with one another. In one embodiment, a fin pitch between the fins 108 is less than 30 nm, but is not particularly limited thereto. The number of the fins 108 shown in FIG. 2B and FIG. 3B is merely for illustration, in some alternative embodiments, three or more parallel semiconductor fins may be formed in accordance with actual design requirements. In one embodiment, the fins 108 have end surfaces 109 on both ends of the fins 108. To be more specific, the fins 108 are fin-like structures with a strip shape (from the top view) and both ends of the fins 108 are the ends at the two opposite short sides from the top-view strip shape. Each fin 108 having one end surface 109 shown in FIG. 2B is merely for illustration, those skilled in the art should understand that each fin 108 has two opposite ends and thus having two end surfaces 109.

After the trenches 106 and the fins 108 are formed, the photo-sensitive pattern 104 is then removed from the surface of the patterned mask layer 102. In one embodiment, an optional cleaning process may be performed to remove a native oxide of the substrate 100 and the fins 108. The cleaning process may be performed using diluted hydrofluoric (DHF) acid or other suitable cleaning solutions.

Figure 2C:
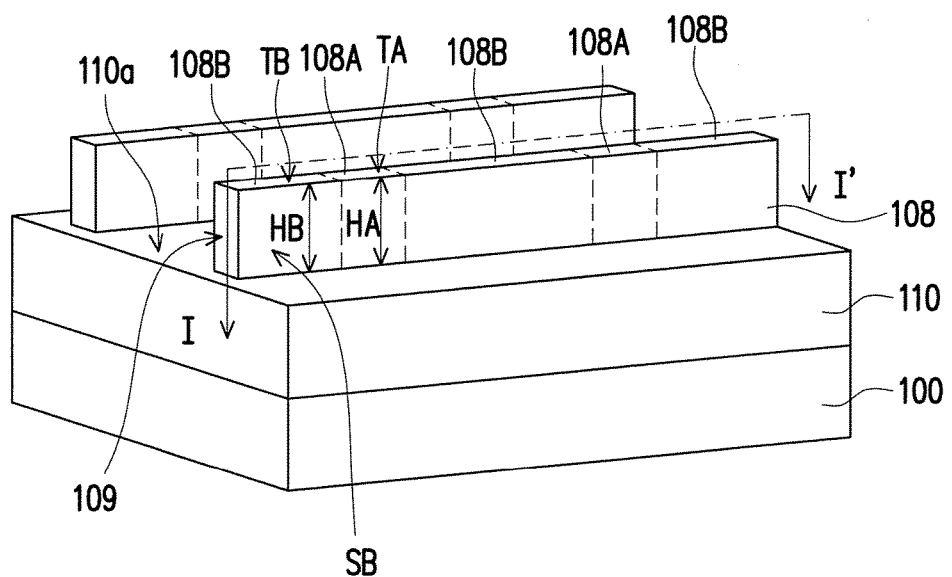
Figure 3C:
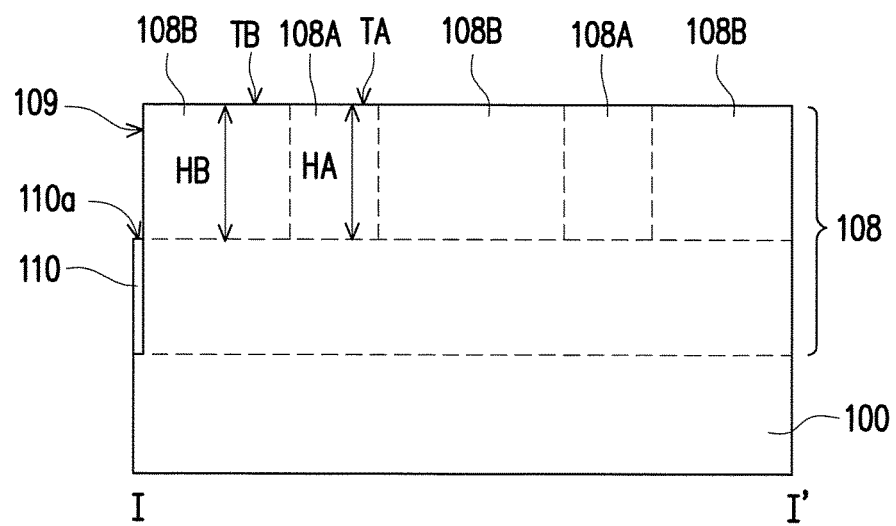

FIG. 2C is a perspective view of the FinFET 10 at one of various stages of the manufacturing method, and FIG. 3C is a cross-sectional view of the FinFET 10 taken along the line I-I' of FIG. 2C. In step S14 in FIG. 1 and as shown in FIG. 2C and FIG. 3C, insulators 110 disposed within the trenches 106 and between the fins 108 are formed. In an embodiment, the insulators 110 are formed by the following steps. The trenches 106 are filled with an insulating material (not shown). In some embodiments, the insulating material includes silicon oxide, silicon nitride, silicon oxynitride, a spin-on dielectric material, or a low-k dielectric material, and the insulating material is formed by high-density-plasma chemical vapor deposition (HDP-CVD), sub-atmospheric CVD (SACVD) or by spin-on. Afterwards, the remained mask layer 102 (referring to FIG. 2B and FIG. 3B) is removed and the insulating material filled in the trenches 106 between the fins 108 is partially removed by an etching process, and the insulating material remained within the trenches 106 becomes insulators 110. In one embodiment, the etching process is performed by using a wet etching process with hydrofluoric acid (HF). In another embodiment, the etching process is performed by using a dry etching process.

In an embodiment, portions of the fins 108 are protruded from the top surfaces 110a of the insulators 110. That is, the top surfaces 110a of the insulators 110 located within the trenches 106 are lower than the top surfaces 108a of the fins 108. In one embodiment, the protruded portions of the fins 108 include channel portions 108A and flank portions 108B beside the channel portions 108A. In other words, the protruded portions of the fins 108 include the flank portions 108B and the channel portions 108A sandwiched between the flank portions 108B. Furthermore, in certain embodiments, the height HB of the flank portions 108B and the height HA of the flank portions 108A measuring form the top surfaces 110a of the insulators 110 are substantially the same. That is, top surfaces TB of the flank portions 108B are substantially flush with or coplanar with top surfaces TA of the channel portions 108A, and the top surfaces TB and the top surfaces TA are connected with each other to constitute the top surfaces 108a of the fins 108. In an embodiment, the insulators 110 cover portions of end surfaces 109 of the fins 108. That is, portions of end surfaces 109 adjoining the side surfaces SB of the flank portions 108B at the ends of the fins 108 are located above the top surfaces 110a of the insulators 110, and the side surfaces SB of each of the flank portions 108B adjoin the top surface TB of each of the flank portions 108B.

Figure 2D:
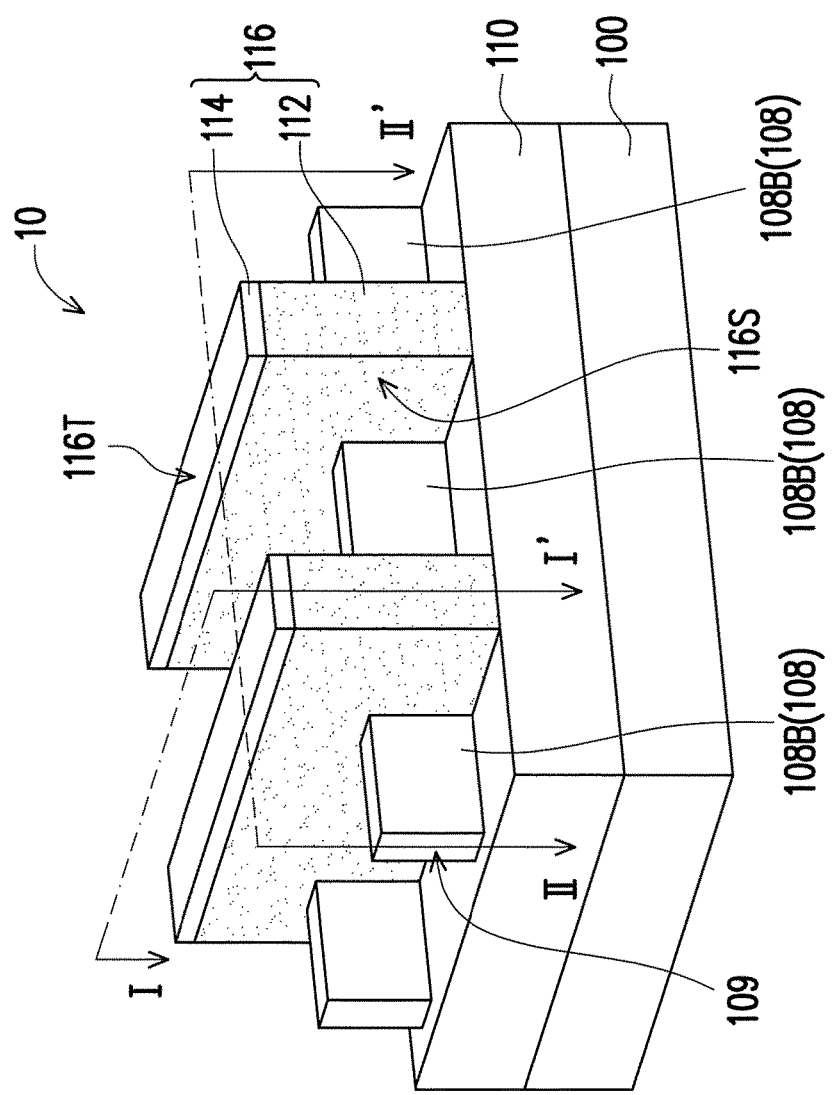
Figure 3D:
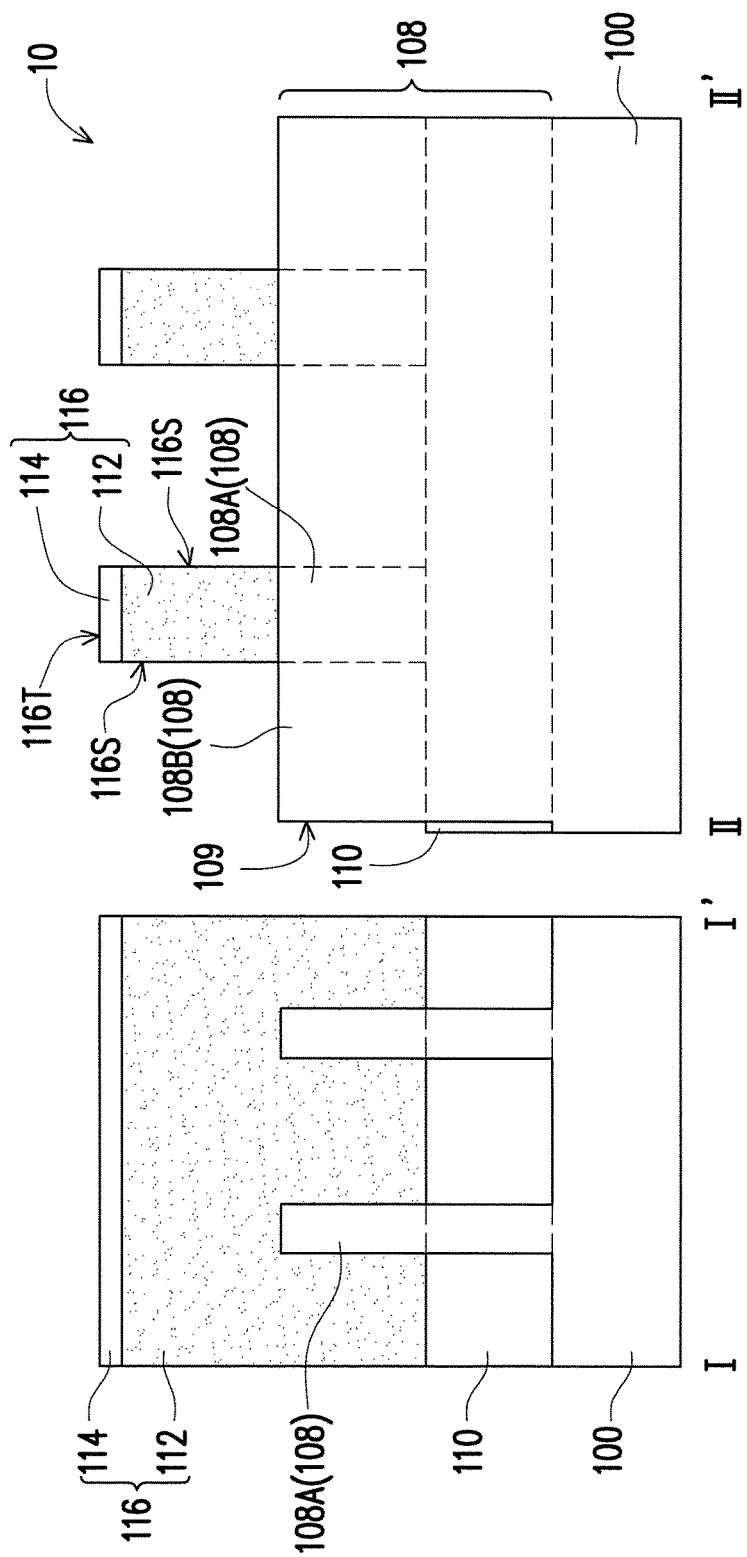

FIG. 2D is a perspective view of the FinFET 10 at one of various stages of the manufacturing method, and FIG. 3D is a cross-sectional view of the FinFET 10 taken along the line I-I' and the line II-II' of FIG. 2D. In step S16 in FIG. 1 and as shown in FIG. 2D and FIG. 3D, stack strip structures 116 are formed over the substrate 100 and on the insulators 110. In FIG. 2D and FIG. 3D, two stack strip structures 116 are shown, the number of the stack strip structures 116 are for illustrative purposes but not intended to limit the structure of the present disclosure, and the number of the stack strip structures 116 may be one or more than one. In some embodiments, the extension direction of the stack strip structures 116 is arranged to be perpendicular to the extension direction of the fins 108, and the stack strip structures 116 are arranged across the fins 108 and covers the channel portions 108A of the fins 108 without covering the flank portions 108B of the fins 108. In some embodiments, the stack strip structures 116 are arranged in parallel. To be more specific, each of the stack strip structures 116 comprises a polysilicon strip 112, and a hard mask strip 114 located on the polysilicon strip 112. In some embodiments, the stack strip structures 116 are formed by depositing a polysilicon layer (not shown), a hard mask layer (not shown) over the polysilicon layer and then patterning the hard mask layer and the polysilicon layer to form the polysilicon strips 112 and the hard mask strips 114. Optionally, an oxide layer (not shown) is formed before forming the polysilicon layer to protect the fins 108. In one embodiment, the material of the hard mask strip 114 may include silicon nitride, silicon oxide or the combination thereof. In some embodiments, each of the stack strip structures 116 has a top surface 116T connected with side surfaces 116S.

Figure 2E:
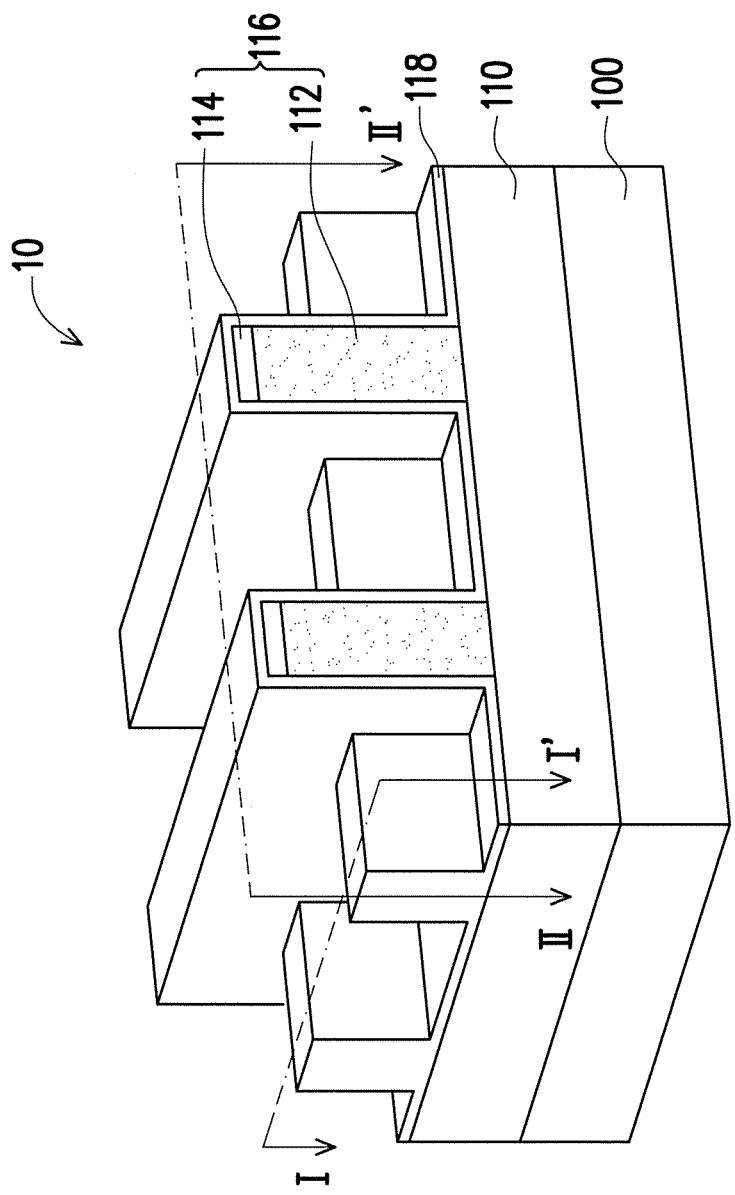
Figure 3E:
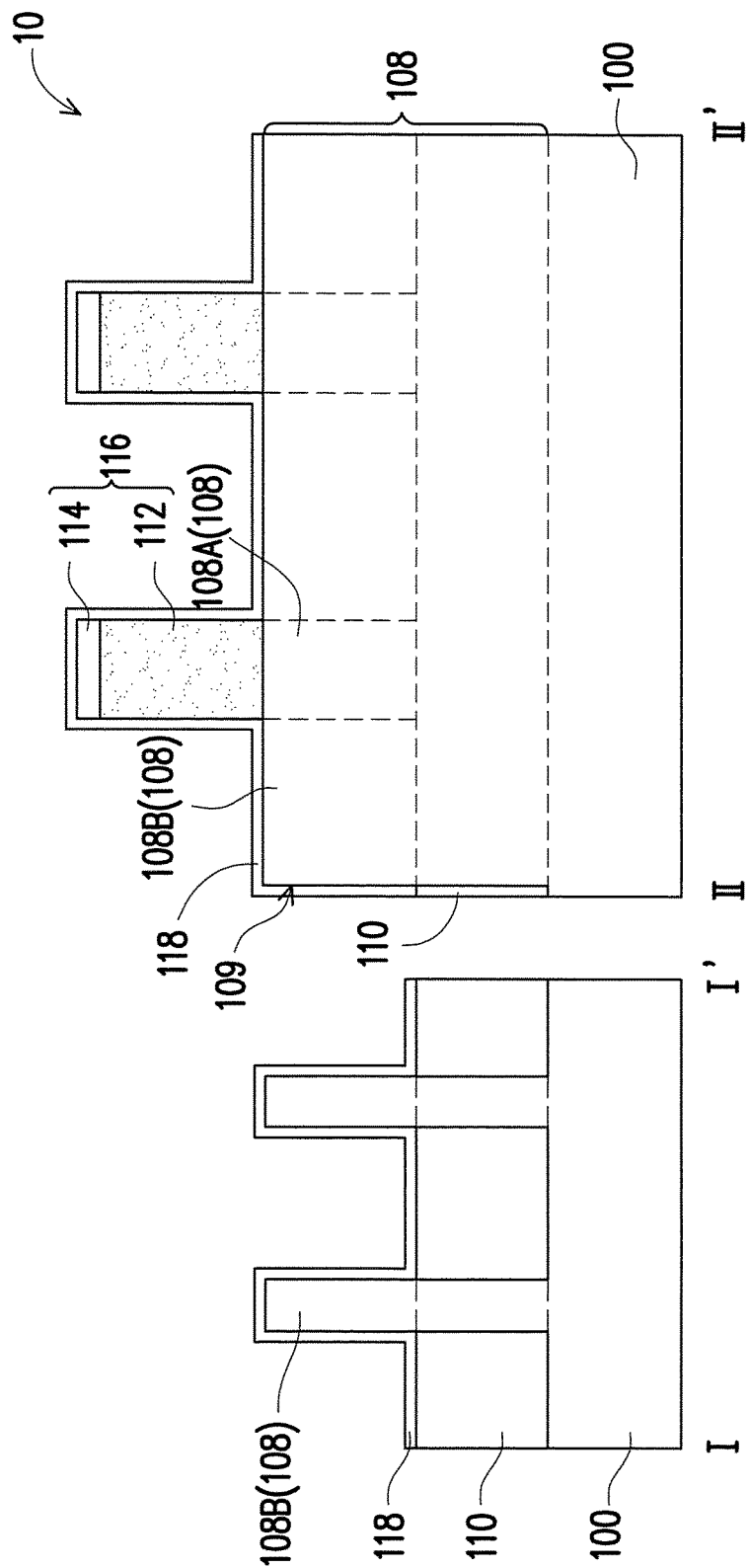

FIG. 2E is a perspective view of the FinFET 10 at one of various stages of the manufacturing method, and FIG. 3E is a cross-sectional view of the FinFET 10 taken along the line I-I' and the line II-II' of FIG. 2E. As shown in step S18 of FIG. 1 and in FIG. 2E and FIG. 3E, a spacer material layer 118 is formed blanketly over the substrate 100, covering the stack strip structures 116 and covering the flank portions 108B of the fins 108. To be more specific, the spacer material layer 118 conformally covers the stack strip structures 116 and conformally covers the flank portions 108B of the fins 108. In one embodiment, the spacer material layer 118 conformally covers the end surfaces 109 of the fins 108. In some embodiments, the spacer material layer 118 is formed of one or more dielectric materials, such as silicon nitride, silicon carbon oxynitride (SiCON), silicon carbonitride (SiCN) or combinations thereof. In some embodiments, the spacer material layer 118 is formed by depositing a blanket layer of one or more dielectric materials by CVD. In one embodiment, the spacer material layer 118 has a thickness ranging from about 3 nm to 10 nm.

Figure 2F:
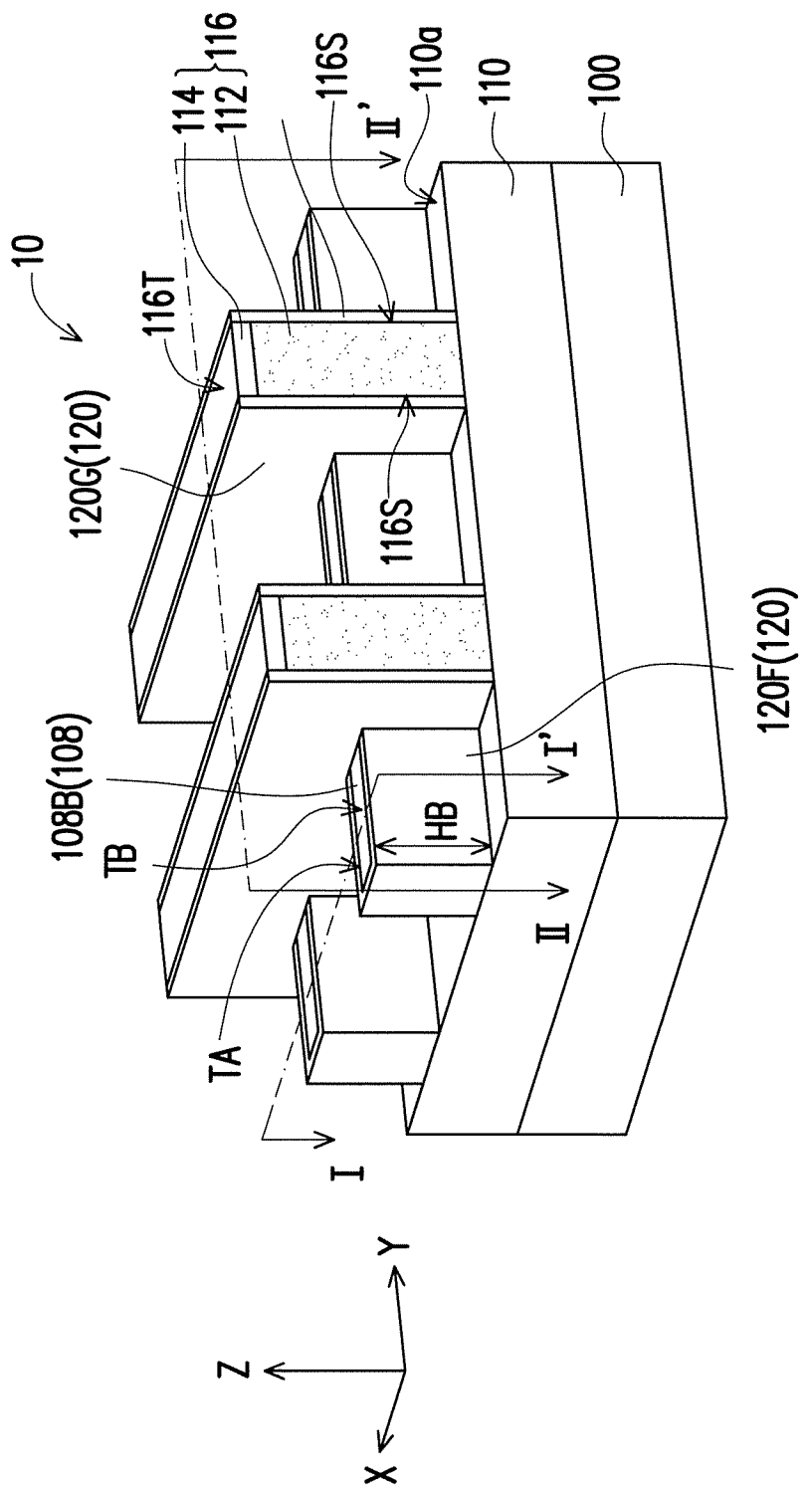
Figure 3F:
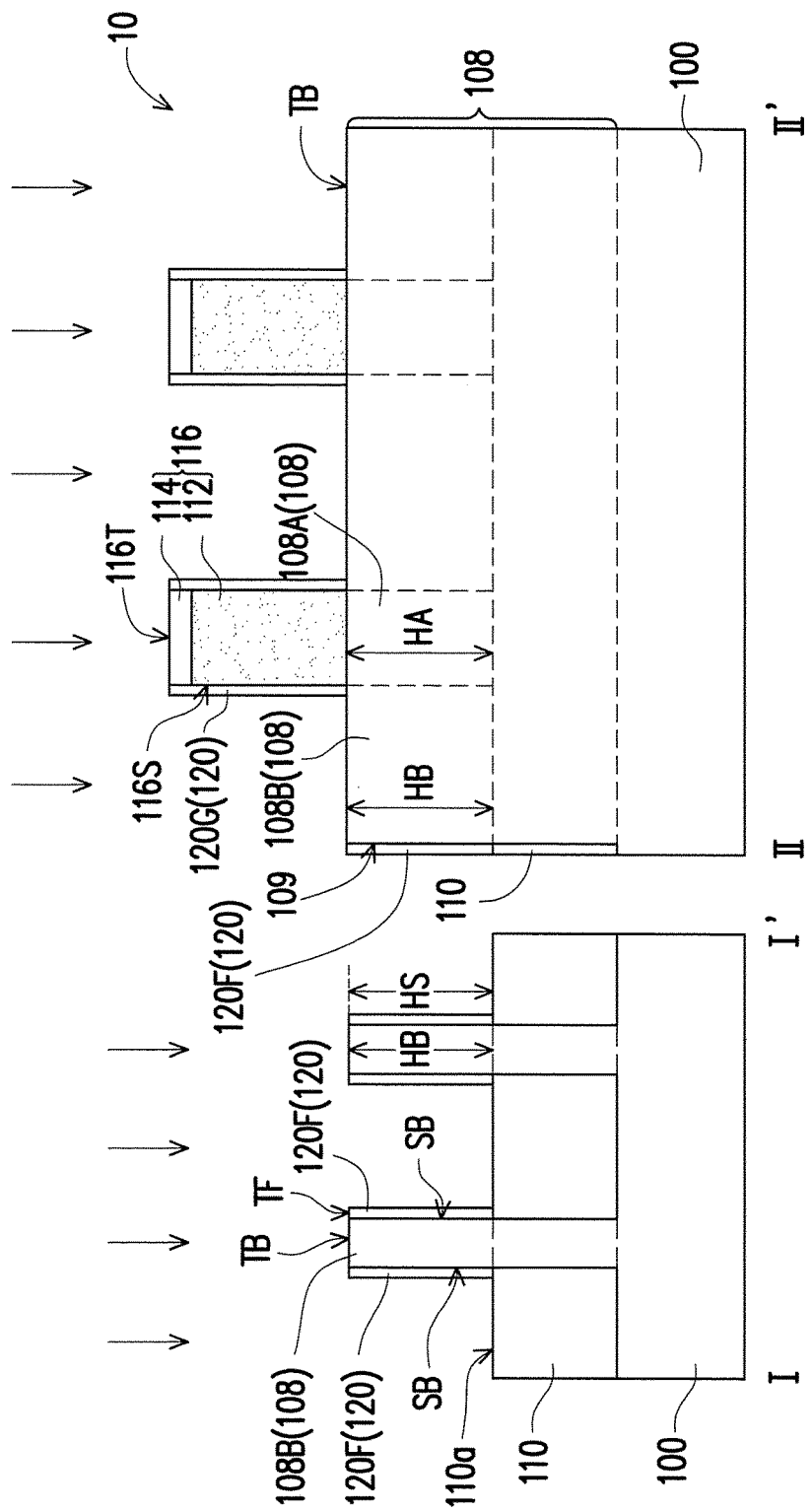

FIG. 2F is a perspective view of the FinFET 10 at one of various stages of the manufacturing method, and FIG. 3F is a cross-sectional view of the FinFET 10 taken along the line I-I' and the line II-II' of FIG. 2F. As shown in step S20 of FIG. 1 and in FIG. 2F and FIG. 3F, the spacer material layer 118 is selectively removed to expose the top surfaces TB of the flank portions 108B of the fins 108 and top surfaces 116T of the stack strip structures 116 so as to form a spacer layer 120. To be more specific, the spacer layer 120 includes spacers 120F remained on the side surfaces SB of the flank portions 108B and gate spacers 120G remained on side surfaces 116S of the stack strip structures 116. In one embodiment, the material of spacers 120F is the same as the material of gate spacers 120G as the spacers 120F and the gate spacers 120G are formed from the same spacer material layer 118. The material of the spacer layer 120 may include silicon nitride, silicon carbon oxynitride (SiCON), silicon carbonitride (SiCN) or combinations thereof, for example. In some embodiments, the spacer layer 120 may be a single layer or a multilayered structure.

In some embodiments, the spacer material layer 118 is removed via performing an anisotropic etching process. In some embodiments, the anisotropic etching process is a direction-specific anisotropic etching process (the arrow in the FIG. 3F indicates the etching direction). In one embodiment, the anisotropic etching process aims to remove specifically the material on the horizontal surfaces (e.g. x-y plane, parallel to the substrate surface), without removing the material located on the vertical or perpendicular surface(s) (e.g. x-z or y-z planes). That is, portions of the spacer material layer 118 located on the top surfaces TB of the flank portions 108B and portions of the spacer material layer 118 located on the top surfaces 116T of the stack strip structures 116 are etched off but portions of the spacer material layer 118 located on the side surfaces SB of the flank portions 108B and portions of the spacer material layer 118 located on side surfaces 116S of the stack strip structures 116 are remained. In addition, the flank portions 108B of the fins 108 are of substantially the same height as that of the channel portions 108A of the fins 108 after removing the spacer material layer 118 by the anisotropic etching process. That is, the anisotropic etching process selectively removes the spacer material layer 118 without substantially removing the flank portions 108B of the fin 108, and thus the height HB of the flank portions 108B and the height HA of the flank portions 108A do not change noticeably before and after the anisotropic etching process. Also, the flank portions 108B of the fins 108 are not recessed after removing the spacer material layer 118 thereon by the anisotropic etching process. Moreover, the height HB of the flank portions 108B and the height HS of the spacers 120F are substantially the same measuring form the top surfaces 110a of the insulators 110. That is, the anisotropic etching process selectively removes the spacer material layer 118 located above the level of the top surfaces TB of the flank portions 108B to expose the top surfaces TB of the flank portions 108B without substantially removing the spacer material layer 118 on side surfaces SB of the flank portions 108B. Also, the top surfaces TB of the flank portions 108B are substantially flush with or coplanar with the top surfaces TF of the spacers 120F.

In one embodiment, the spacers 120F are disposed on the end surfaces 109 of the fins 108. That is, the end surfaces 109 adjoining the side surfaces SB of the flank portions 108B at the ends of the fins 108 are covered by the spacers 120F of the spacer layer 120. In one embodiment, the spacer material layer 118 located on the top surfaces 110a of the insulators 110 is removed to expose the top surfaces 110a of the insulators 110. In certain embodiments, in the anisotropic etching process, a portion of the spacer material layer 118 located on the top surfaces TB of the flank portions 108B, a portion of the spacer material layer 118 located on the top surfaces 116T of the stack strip structures 116 and a portion of the spacer material layer 118 located on the top surfaces 110a of the insulators 110 are etched during the same etching process.

Figure 2G:
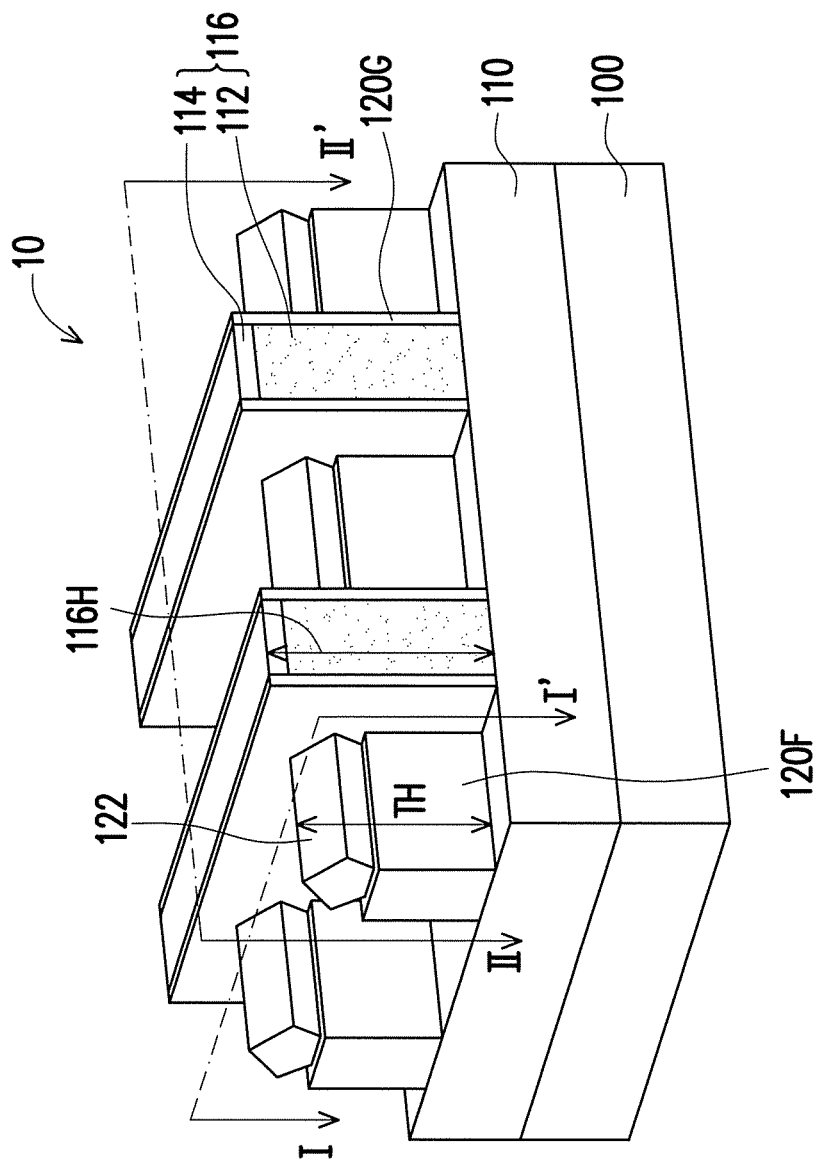
Figure 3G:
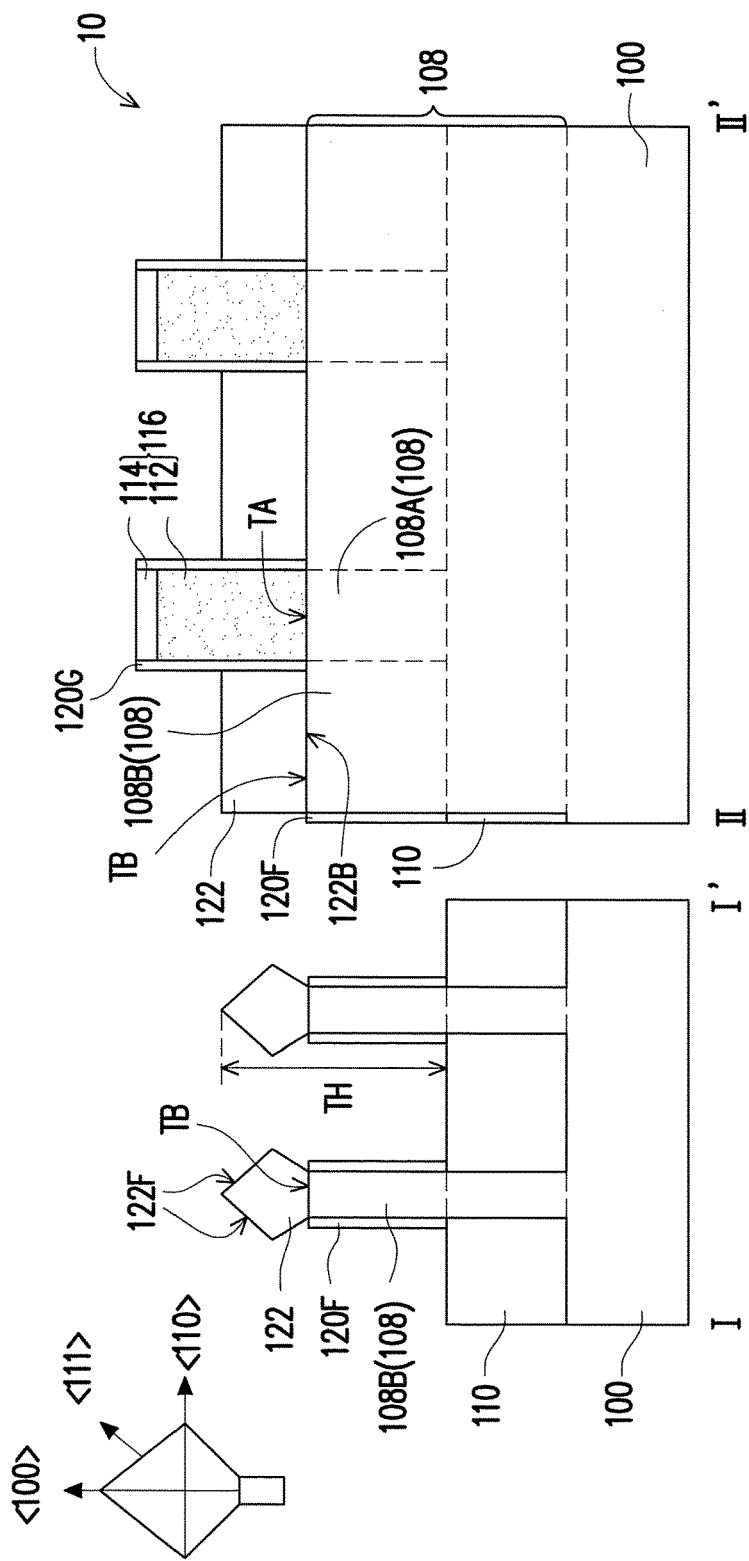

FIG. 2G is a perspective view of the FinFET 10 at one of various stages of the manufacturing method, and FIG. 3G is a cross-sectional view of the FinFET 10 taken along the line I-I' and the line II-II' of FIG. 2G. As shown in step S22 of FIG. 1 and in FIG. 2G and FIG. 3G, epitaxy material portions 122 are formed upward from the exposed top surfaces TB of the flank portions 108B of the fins 108 and are protruded from the top surfaces TB of the flank portions 108B. The epitaxy material portions 122 are disposed directly on and only on the exposed flank portions 108B but not on the spacers 120F. In one embodiment, as mentioned above, after the anisotropic etching process, the top surfaces TB of the flank portion 108B are exposed and spacers 120F surrounding the side surfaces SB of the flank portions 108B and the end surfaces 109 are formed. In certain embodiments, the epitaxy material portions 122 formed selectively on the exposed flank portions 108B substantially cover the top surfaces TB of the flank portions 108B. However, the epitaxy material portions 122 do not cover the side surfaces SB of the flank portions 108B, and the epitaxy material portions 122 do not contact the spacers 120F located on the side surfaces SB of the flank portions 108B. In one embodiment, as mentioned above, the flank portions 108B of the fins 108 that are not etched in the anisotropic etching process are of substantially the same height as those of the channel portions 108A of the fins 108, and thereby the epitaxy material portions 122 formed directly from the top surfaces TB of the flank portions 108B are mostly or wholly located above the top surfaces TB of the flank portions 108B and above the top surfaces TA of the channel portions 108A. Also, in one embodiment, the bottom surfaces 122B of the epitaxy material portions 122 and the top surfaces TA of the channel portions 108A of the fins 108 are located at the same level. In one embodiment, the total height TH of the flank portion 108B and the corresponding epitaxy material portion 122 is equal to or less than the height 116H of the stack strip structures 116 from the top surfaces 110a of the insulators 110.

In some embodiments, the epitaxy material portions 122 include strained materials, and the strained materials may be, for example, a germanium-containing material (such as silicon germanium (SiGe) or boron-doped silicon germanium (SiGeB)), a carbon-containing material (such as silicon carbon (SiC) or phosphorous-doped silicon carbide (SiCP)) or silicon phosphate (SiP). In some embodiments, for a p-type FinFET device, the epitaxy material portions 122 may include SiGe. In alternative embodiments, for an n-type FinFET device, the epitaxy material portions 122 may include SiC, SiP, SiCP or a SiC/SiP multi-layer structure. In some embodiments, the epitaxy material portions 122 may be optionally implanted with an n-type dopant or a p-type dopant as needed. Since the material of the epitaxy material portions 122 has the lattice constant different from that of the material of the substrate 100, the channel region is strained or stressed to increase carrier mobility of the device and enhance the device performance.

In some embodiments, the epitaxy material portions 122 are formed through one or more epitaxial growth processes. In some embodiments, the epitaxial growth process includes a low pressure CVD (LPCVD) process, an atomic layer CVD (ALCVD) process, an ultrahigh vacuum CVD (UHVCVD) process, a reduced pressure CVD (RPCVD) process, a molecular beam epitaxy (MBE) process, a metalorganic vapor phase epitaxy (MOVPE) process or a combination thereof. Alternatively, the epitaxial growth process includes a cyclic deposition-etch (CDE) epitaxy process or a selective epitaxial growth (SEG) process, which is utilized to form the strained material of high crystal quality. In some embodiments, in-situ doping is performed during the epitaxy growth process.

In some embodiments, the epitaxy material portions 122 are formed with facets. In some embodiments, each of the epitaxy material portions 122 has a diamond-like configuration with faceted surfaces that are oriented in the <111> crystallographic direction. In some embodiments, the growth rate of each of the epitaxy material portions 122 in the <111> crystallographic direction is slower than the growth rate of each of the epitaxy material portions 122 in the <110> crystallographic direction, and the growth rate of each of the epitaxy material portions 122 in the <110> crystallographic direction is slower than the growth rate of each of the epitaxy material portions 122 in the <100> crystallographic direction. As can be seen in left side of FIG. 3G, it shows the scheme of the growth model of the strained material of SiGe, which the growth rate of the strained material of SiGe oriented in the <111> crystallographic direction is slower than the growth rate of the strained material of SiGe in the <100> crystallographic) direction and the <110> crystallographic direction. In some embodiments, the top surfaces TB of the flank portions 108B is, for example, oriented with the <100> crystallographic direction.

In some embodiments, the epitaxy material portions 122 and the underlying flank portions 108B of the fins 108 may be implanted to form source and drain regions. The source and drain regions, also called strained source and drain regions, are located at two opposite sides of each corresponding stack strip structure 116. In some embodiments, the source and drain regions are optionally formed with silicide top layers (not shown) by silicidation.

Figure 2H:
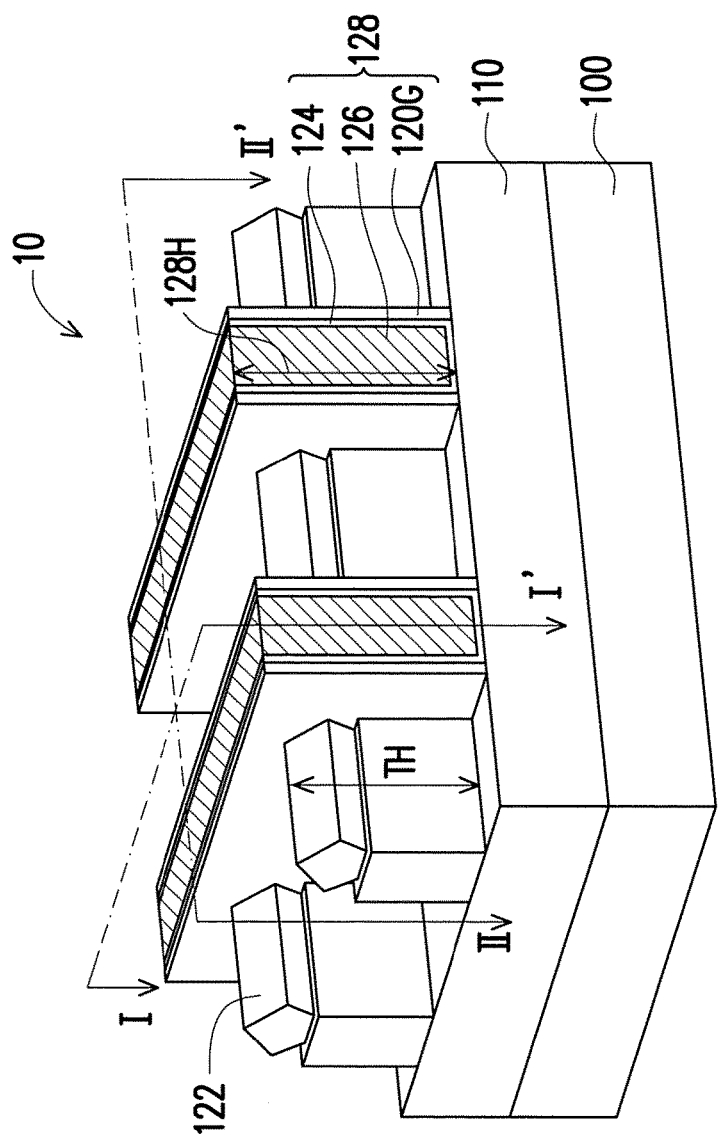
Figure 3H:
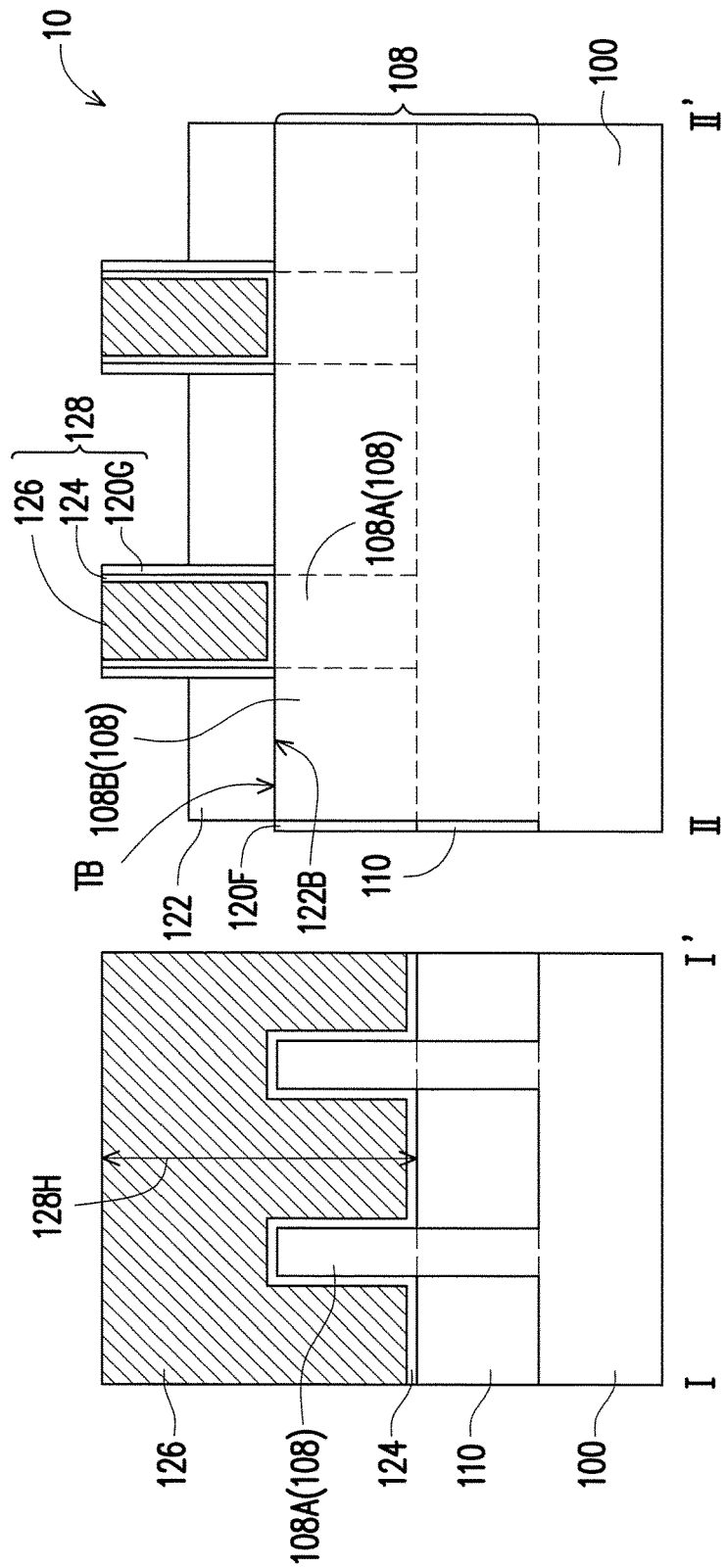

FIG. 2H is a perspective view of the FinFET 10 at one of various stages of the manufacturing method, and FIG. 3H is a cross-sectional view of the FinFET 10 taken along the line I-I' and the line II-II' of FIG. 2H. As shown in step S24 of FIG. 1 and in FIG. 2H and FIG. 3H, the stack strip structures 116 including the polysilicon strips 112 and the hard mask strips 114 located on the channel portions 108A of the fins 108 are removed. In one embodiment, the polysilicon strips 114 and the hard mask strips 116 on the polysilicon strips 114 are removed by anisotropic etching process and the gate spacers 120G are remained. Then in step S26 of FIG. 1 and in FIG. 2H and FIG. 3H, gate stacks 128 are formed over the channel portions 108A of the fins 108 and on the insulators 110. Each of the gate stacks 128 comprises a gate dielectric layer 124, a gate electrode layer 126 and the gate spacers 120G, wherein the gate dielectric layer and the gate electrode layer are located between the gate spacers.

In an embodiment, each of the gate stacks 128 may be formed by the following steps. The gate dielectric layer 124 is formed within the recesses between the gate spacers 120G and over the channel portions 108A of the fins 108. In some embodiments, the material of the gate dielectric layer 124 comprises silicon oxide, silicon nitride or the combination thereof. In some embodiments, the gate dielectric layer 124 comprises a high-k dielectric material, and the high-k dielectric material has a k value greater than about 7.0 and includes a metal oxide or a silicate of Hf, Al, Zr, La, Mg, Ba, Ti, Pb and combinations thereof. In some embodiments, the gate dielectric layer 124 is formed by atomic layered deposition (ALD), molecular beam deposition (MBD), physical vapor deposition (PVD) or thermal oxidation. Next, a gate electrode layer 126 is formed on the gate dielectric layer 124, over the channel portions 108A of the fins 108 and fills the remaining recesses between the gate spacers 120G. In some embodiments, the gate electrode layer 126 comprises a metal-containing material, such as Al, Cu, W, Co, Ti, Ta, Ru, TiN, TiAl, TiAlN, TaN, TaC, NiSi, CoSi or a combination thereof. Depending on whether the FinFET is a p-type FinFET or an n-type FinFET, the materials of the gate dielectric layer 124 and/or the gate electrode layer 126 are chosen. Optionally, a chemical mechanical polishing (CMP) process is performed to remove the excess portions of the gate dielectric layer 124 and the gate electrode layer 126. To be more specific, the stack strip structure 116 (including polysilicon strip 112, hard mask strip 114) is replaced and the replacement gate stack 128 is formed. In some embodiments described herein, the gate stack 128 is a replacement metal gate, but the structure(s) of the gate stack(s) or the fabrication processes thereof are not limited by these embodiments.

In some embodiments, the total height TH of the flank portion 108B and the corresponding epitaxy material portion 122 is equal to or less than the height 128H of the gate stacks 128 the top surfaces 110a of the insulators 110. In some embodiments, the source and drain regions are located on two opposite sides of the corresponding gate stack 128, and the gate stacks 128 cover the channel portions 108A of the fins 108. In FIG. 2H and FIG. 3H, two gate stacks 128 are shown, the number of the gate stacks 128 are for illustrative purposes but not intended to limit the structure of the present disclosure, and the number of the gate stacks 128 may be one or more than one. In some embodiments, the extension direction of the gate stacks 128 is arranged to be perpendicular to the extension direction of the fins 108, and the gate stacks 128 are arranged across the fins 108. In some embodiments, the gate stacks 128 are arranged in parallel.

Figure 4:
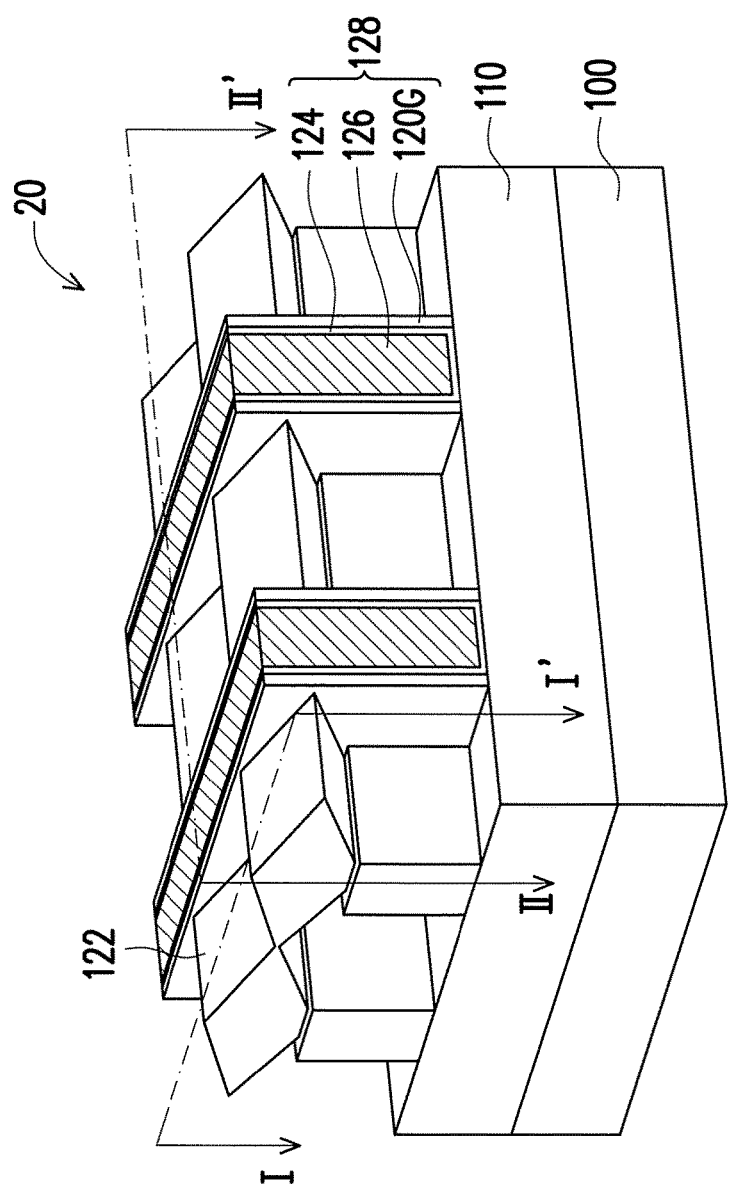
FIG. 4 is a perspective view of a FinFET in accordance with some embodiments of the present disclosure.
Figure 5:
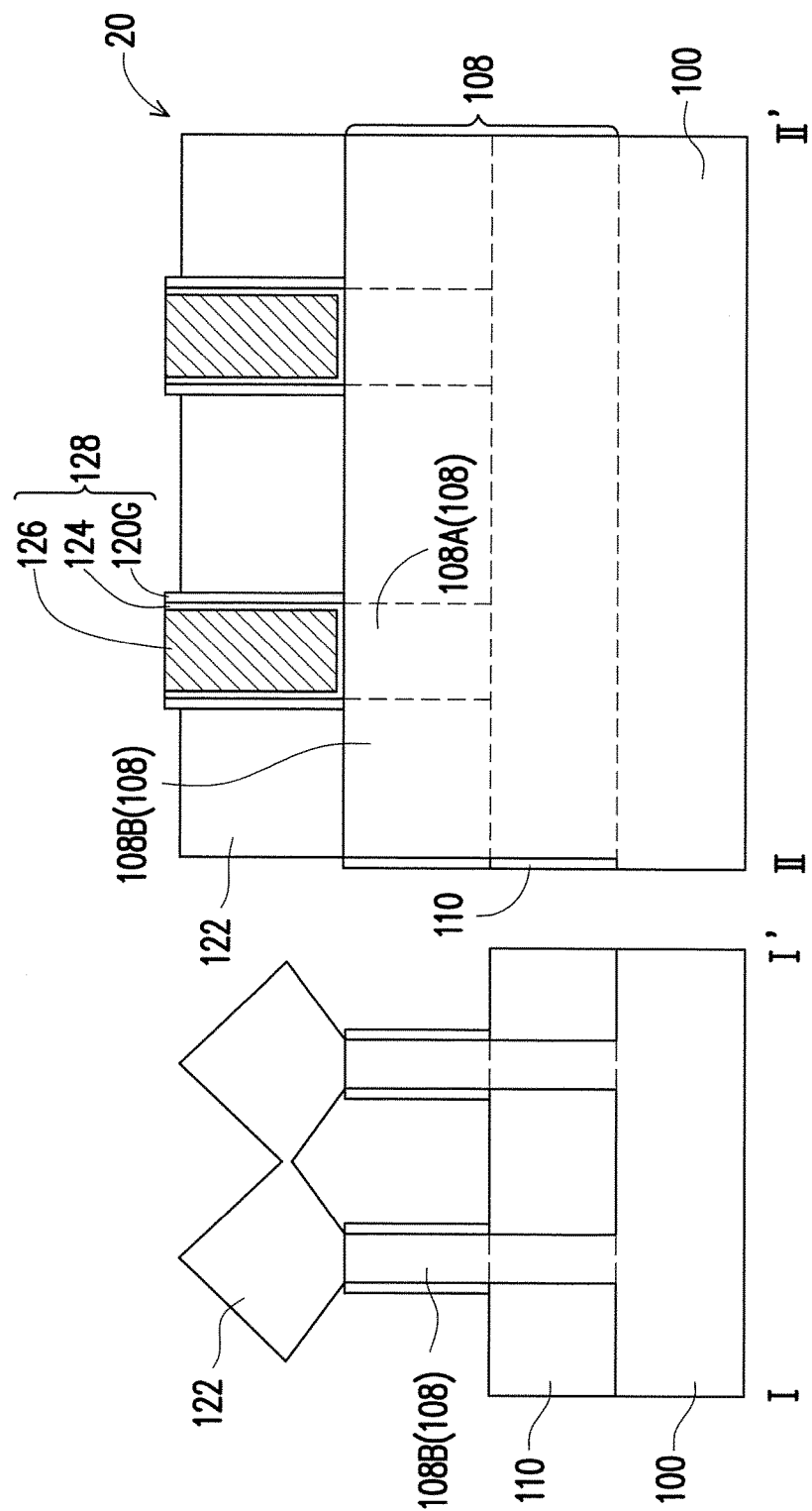
FIG. 5 is cross-sectional view of a FinFET in accordance with some embodiments of the present disclosure.

In FIG. 2H and FIG. 3H, the epitaxy material portions 122 formed on the flank portions 108B of one fin 108 are separate from the epitaxy material portions 122 formed on the flank portions 108B of another adjacent fin 108. That is, the epitaxy material portions 122 disposed on different fins 108 do not contact each other. However, the disclosure is not limited thereto. The following descriptions will be provided in regard to other embodiments as shown in FIG. 4 and FIG. 5. FIG. 4 is a perspective view of a FinFET in accordance with some embodiments of the present disclosure. FIG. 5 is cross-sectional view of a FinFET in accordance with some embodiments of the present disclosure. It should be noted that the reference numerals and some descriptions provided in the previous embodiments are applicable in the following embodiments, in which identical or similar reference numerals indicate identical or similar elements, and repeated descriptions of the same technical contents are omitted.

Please refer to the descriptions provided in the previous embodiments for the omitted contents, which will not be repeated hereinafter.

FIG. 4 is a perspective view of the FinFET 20 at one of various stages of the manufacturing method, and FIG. 5 is a cross-sectional view of the FinFET 20 taken along the line I-I' of FIG. 4. As shown in FIG. 4 and FIG. 5, the epitaxy material portions 122 formed on the flank portions 108B of one fin 108 merge with the epitaxy material portions 122 formed on the flank portions 108B of another adjacent fin 108. That is, the epitaxy material portions 122 disposed on different fins 108 do contact each other. In one embodiment, the FinFET 20 is a p-type FinFET device, and the epitaxy material portions 122 may include SiGe.

In the above embodiments, during the formation of the spacer layer 120, the flank portions 108B of the fins 108 are not recessed and have substantially the same height as the channel portions 108A of the fins 108, and the epitaxy material portions 122 are disposed on the flank portions 108B. Owing to the raised epitaxy material portions 122 (e.g. located above the non-recessed flank portions 108B), the FinFETs 10, 20 can have longer channel length compare to the FinFET with the recessed fins. Accordingly, the resultant FinFET manufactured by the method described in the above embodiments has better electrical performance including lower leakage current and low operation power, as short channel effect (SCE) and drain induced barrier lowering (DIBL) effect are alleviated and the on/off current ratio (Ion/Ioff) of the FinFET is increased. Furthermore, since the flank portions 108B of the fins 108 are not recessed in the manufacturing method described in the above embodiments, no extra etching processes and no extra mask are needed, leading to lower production costs.

In some embodiments of the present disclosure, a fin-type field effect transistor comprising a substrate, at least one gate stack, spacers and epitaxy material portions is described. The substrate has fins and insulators located between the fins, and the fins comprise channel portions and flank portions beside the channel portions, the flank portions and the channel portions of the fins are protruded from the insulators, the flank portions of the fins and the channel portions of the fins have substantially a same height from top surfaces of the insulators, and each of the flank portions of the fins has a top surface and side surfaces adjoining the top surface. The at least one gate stack is disposed over the substrate, disposed on the insulators and over the channel portions of the fins. The spacers are disposed on the side surfaces of the flank portions of the fins. The epitaxy material portions are located above the top surfaces of the flank portions of the fins.

In some embodiments of the present disclosure, a fin-type field effect transistor comprising a substrate, at least one gate stack, spacers and epitaxy material portions is described. The substrate has fins and insulators between the fins, wherein the fins comprise flank portions and channel portions sandwiched between the flank portions, and the fins have end surfaces. The at least one gate stack is disposed across and over the channel portions of the fins and disposed on the insulators. The spacers are disposed on side surfaces of the flank portions of the fins and the end surfaces of the fins. The epitaxy material portions are disposed on flank portions, wherein the flank portions and the channel portions of the fins are protruded from top surfaces of the insulators and have substantially a same height from the top surfaces of the insulators, and the epitaxy material portions are protruded from top surfaces of the flank portions.

In some embodiments of the present disclosure, a method for forming a fin-type field effect transistor is described. A substrate is provided. The substrate is patterned to form trenches in the substrate and fins between the trenches, wherein the fins comprise channel portions and flank portions. Insulators are formed in the trenches of the substrate. At least one stack strip structure is formed over the substrate and on the insulators. A spacer material layer is formed covering the at least one stack strip structure and covering the flank portions. The spacer material layer is removed to expose top surfaces of the flank portions and to expose a top surface of the at least one stack strip structure, and spacers on side surfaces of the flank portions and gate spacers on side surfaces of the at least one stack strip structure are formed. Epitaxy material portions are formed directly from the exposed top surfaces of the flank portions. The at least one stack strip structure is removed. At least one gate stack is formed on the insulators and covering the channel portions of the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin-type field effect transistor, comprising:
   a substrate having fins and insulators located between the fins, wherein the fins comprise channel portions and flank portions beside the channel portions, the flank portions and the channel portions of the fins are protruded from the insulators, the flank portions of the fins and the channel portions of the fins have substantially a same height from top surfaces of the insulators, and each of the flank portions of the fins has a top surface and side surfaces adjoining the top surface;
   at least one gate stack, disposed over the substrate, disposed on the insulators and over the channel portions of the fins;
   spacers, disposed on the side surfaces of the flank portions of the fins; and
   epitaxy material portions, located above the top surfaces of the flank portions of the fins.

2. The transistor of claim 1, wherein the epitaxy material portions cover the top surfaces of the flank portions without contacting the spacers.

3. The transistor of claim 1, wherein the spacers cover end surfaces of the fins without covering the top surfaces of the flank portions.

4. The transistor of claim 1, wherein a total height of the flank portion and the corresponding epitaxy material portion is equal to or less than a height of the at least one gate stack from the top surface of the insulator.

5. The transistor of claim 1, wherein the at least one gate stack comprises:
   a gate dielectric layer, disposed on the insulators and covering the channel portions of the fins;
   a gate electrode layer, disposed on the gate dielectric layer; and gate spacers, wherein the gate dielectric layer and the gate electrode layer are located between the gate spacers.

6. The transistor of claim 5, wherein a material of spacers is the same as a material of gate spacers.

7. The transistor of claim 6, wherein the material of the spacers and the material of gate spacers comprise silicon nitride, silicon carbon oxynitride (SiCON), silicon carbonitride (SiCN) or combinations thereof.

8. A fin-type field effect transistor, comprising:
a substrate having fins and insulators between the fins, wherein the fins comprise flank portions and channel portions sandwiched between the flank portions, and the fins have end surfaces;
at least one gate stack, disposed across and over the channel portions of the fins and disposed on the insulators;
spacers, disposed on side surfaces of the flank portions of the fins and the end surfaces of the fins; and
epitaxy material portions, disposed on the flank portions, wherein the flank portions and the channel portions of the fins are protruded from top surfaces of the insulators and have substantially a same height from the top surfaces of the insulators, and the epitaxy material portions are protruded from top surfaces of the flank portions.

9. The transistor of claim 8, wherein the flank portions of the fins and the spacers have substantially a same height from the top surfaces of the insulators.

10. The transistor of claim 8, wherein a total height of the flank portion and the corresponding epitaxy material portion is equal to or less than a height of the at least one gate stack.

11. The transistor of claim 8, wherein the epitaxy material portions are located above top surfaces of the channel portions.

12. The transistor of claim 8, wherein the at least one gate stack comprises a replacement metal gate.

13. The transistor of claim 8, wherein the at least one gate stack comprises:
a gate dielectric layer, disposed on the insulators and covering the channel portions of the fins;
a gate electrode layer, disposed on the gate dielectric layer; and
gate spacers, wherein the gate dielectric layer and the gate electrode layer are located between the gate spacers.

14. The transistor of claim 8, wherein the epitaxy material portions disposed on the flank portions of one fin merge with the epitaxy material portions disposed on the flank portions of another adjacent fin.

15. A method for forming a fin-type field effect transistor, comprising:
providing a substrate;
patterning the substrate to form trenches in the substrate and fins between the trenches, wherein the fins comprise channel portions and flank portions;
forming insulators in the trenches of the substrate;
forming at least one stack strip structure over the substrate and on the insulators;
forming a spacer material layer covering the at least one stack strip structure and covering the flank portions;
removing the spacer material layer to expose top surfaces of the flank portions and a top surface of the at least one stack strip structure to form spacers on side surfaces of the flank portions and form gate spacers on side surfaces of the at least one stack strip structure;
forming epitaxy material portions directly from the exposed top surfaces of the flank portions;
removing the at least one stack strip structure; and
forming at least one gate stack on the insulators and covering the channel portions of the fins.

16. The method of claim 15, wherein removing the spacer material layer further comprises removing the spacer material layer from the top surfaces of the flank portions without removing the spacer material layer from the side surfaces of the flank portions and without removing the spacer material layer from end surfaces of the fins.

17. The method of claim 15, wherein removing the spacer material layer further comprises removing the spacer material layer from top surfaces of the insulators.

18. The method of claim 15, wherein removing the spacer material layer further comprises removing the spacer material layer from the top surfaces of the flank portions without removing the flank portions, so that the flank portions and the channel portions of the fins have substantially a same height from top surfaces of the insulators after removing the spacer material layer.

19. The method of claim 15, wherein forming epitaxy material portions comprises performing a selective epitaxy growth process to form the epitaxy material portions directly from the exposed top surfaces of the flank portions.

20. The method of claim 15, wherein removing the spacer material layer comprises performing an anisotropic etching process.

* * * * *